United States Patent
Jeong et al.

(10) Patent No.: US 8,179,039 B2
(45) Date of Patent: May 15, 2012

(54) LIGHT EMITTING DEVICE, METHOD OF MANUFACTURING THE SAME, LIGHT EMITTING DEVICE PACKAGE, AND ILLUMINATION SYSTEM

(75) Inventors: Hwan Hee Jeong, Seoul (KR); Sang Youl Lee, Seoul (KR); Ji Hyung Moon, Seoul (KR); June O Song, Seoul (KR); Kwang Ki Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/028,686

(22) Filed: Feb. 16, 2011

(65) Prior Publication Data

US 2011/0198991 A1    Aug. 18, 2011

(30) Foreign Application Priority Data

Feb. 18, 2010   (KR) .................. 10-2010-0014439

(51) Int. Cl.
*H05B 33/00*   (2006.01)
*F21V 1/00*    (2006.01)

(52) U.S. Cl. ........ 313/506; 313/512; 362/611; 362/257; 362/362

(58) Field of Classification Search .................. None
See application file for complete search history.

(56) References Cited

U.S. PATENT DOCUMENTS

| | | | |
|---|---|---|---|
| 2008/0315232 | A1 | 12/2008 | Matsuo et al. |
| 2009/0154513 | A1 | 6/2009 | Shin |
| 2011/0175130 | A1* | 7/2011 | Lee ................. 257/98 |
| 2011/0220936 | A1* | 9/2011 | Fujimoto et al. ......... 257/98 |
| 2011/0254041 | A1* | 10/2011 | Lee ................. 257/98 |
| 2011/0297992 | A1* | 12/2011 | Choi et al. ............. 257/98 |

FOREIGN PATENT DOCUMENTS

| | | |
|---|---|---|
| KR | 10-0632006 B1 | 9/2006 |
| KR | 10-2007-0079957 A | 8/2007 |
| KR | 10-2009-0119259 A | 11/2009 |
| WO | WO 2009/016529 A1 | 2/2009 |

* cited by examiner

*Primary Examiner* — Ashok Patel
(74) *Attorney, Agent, or Firm* — McKenna Long & Aldridge LLP

(57) ABSTRACT

Disclosed are a light emitting device, a method of manufacturing the same, a light emitting device package, and an illumination system. The light emitting device includes a transmissive substrate, an ohmic layer on the transmissive substrate, a light emitting structure on the ohmic layer and including a first conductive semiconductor layer, a second conductive semiconductor layer, and an active layer between the first and second semiconductor layers, a electrode layer on a bottom surface of the transmissive substrate, and a conductive via electrically connecting the light emitting structure with the electrode layer through the transmissive substrate wherein an area of the transmissive substrate is increased toward an upper portion thereof from a lower portion.

20 Claims, 8 Drawing Sheets

LIGHT EMITTING DEVICE, METHOD OF MANUFACTURING THE SAME, LIGHT EMITTING DEVICE PACKAGE, AND ILLUMINATION SYSTEM

The present application claims priority under 35 U.S.C. §119(a) of Korean Patent Application No. 10-2010-0014439 filed on Feb. 18, 2010, which is hereby incorporated by reference in its entirety as if fully set forth herein.

BACKGROUND

A light emitting diode (LED) is a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for illumination devices such as various lamps, liquid crystal displays, electric signboards, and street lamps.

SUMMARY

The embodiment provides a light emitting device having a novel structure, a method of manufacturing the same, a light emitting device package, and an illumination system.

The embodiment provides a light emitting device representing improved light extraction efficiency, a method of manufacturing the same, a light emitting device package, and an illumination system.

According to the embodiment, a light emitting device includes a transmissive substrate, an ohmic layer on the transmissive substrate, a light emitting structure on the ohmic layer and including a first conductive semiconductor layer, a second conductive semiconductor layer, and an active layer between the first and second semiconductor layers, a electrode layer on a bottom surface of the transmissive substrate; and a conductive via electrically connecting the light emitting structure with the electrode layer through the transmissive substrate wherein an area of the transmissive substrate is increased toward an upper portion thereof from a lower portion.

According to the embodiment, a light emitting device package includes a package body, first and second electrodes installed in the package body, and a light emitting device provided on the package body and electrically connected with the first and second electrodes. The light emitting device includes a transmissive substrate, an ohmic layer on the transmissive substrate, a light emitting structure on the ohmic layer and including first and second conductive semiconductor layers and an active layer between the first and second conductive semiconductor layers to generate light, a electrode layer on a bottom surface of the transmissive substrate, and a conductive via electrically connecting the light emitting structure with the electrode layer through the transmissive substrate wherein an area of the transmissive substrate is increased toward an upper portion thereof from a lower portion.

According to the embodiment, an illumination system includes a light emitting module including a substrate and a light emitting device mounted on the substrate. The light emitting device includes a transmissive substrate, an ohmic layer on the transmissive substrate, a light emitting structure on the ohmic layer and including first and second conductive semiconductor layers and an active layer between the first and second conductive semiconductor layers to generate light, a electrode layer on a bottom surface of the transmissive substrate, and a conductive via electrically connecting the light emitting structure with the electrode layer through the transmissive substrate wherein an area of the transmissive substrate is increased toward an upper portion thereof from a lower portion.

According to the embodiment, a method of manufacturing a light emitting device includes forming a first body by sequentially forming a light emitting structure, an ohmic layer, and a first adhesive layer on a growth substrate, forming a second body by forming a second adhesive layer making contact with the first adhesive layer on a transmissive substrate, and forming a hole through the transmissive substrate, bonding the first body with the second body by bonding the first adhesive layer and the second adhesive layer with each other in opposition to each other, removing the growth substrate, and forming a conductive via by filling the hole with a conductive material, and forming a electrode layer on a bottom surface of the transmissive substrate wherein an area of the transmissive substrate is increased toward an upper portion thereof from a lower portion.

DETAILED DESCRIPTION OF THE EMBODIMENTS

Figure 1:
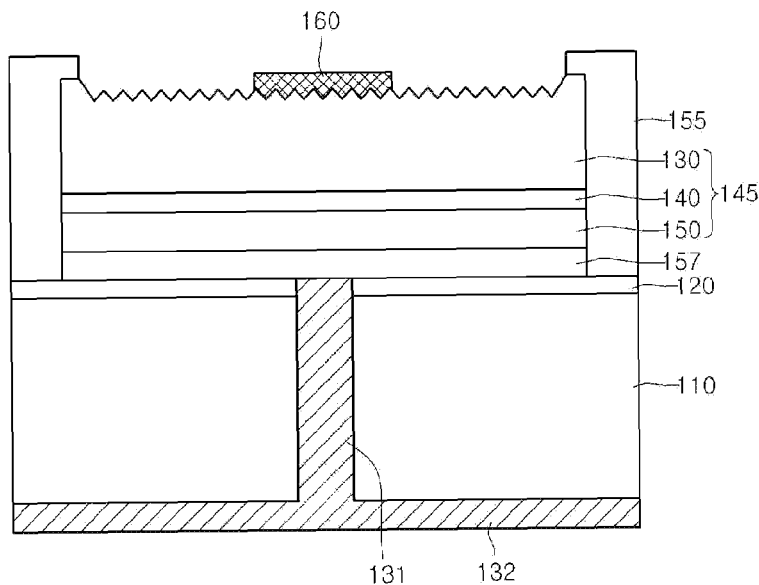
FIG. 1 is a sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a method of manufacturing the light emitting device, a light emitting device package, and an illumination system according to the embodiments will be described with reference to the accompanying drawings.

FIG. 1 is a sectional view showing a light emitting device 100 according to a first embodiment.

Referring to FIG. 1, the light emitting device 100 includes a transmissive substrate 110, an ohmic layer 157 above the transmissive substrate 100, a light emitting structure 145 formed above the ohmic layer 157 to generate light, a electrode layer 132 formed on a bottom surface of the transmissive substrate 110, and a conductive via 131 to electrically connect the light emitting structure 145 with the electrode layer 132 through the transmissive substrate 100.

The light emitting structure 145 may include a plurality of compound semiconductor layers. For example, the light emitting structure 145 may include a first conductive semiconductor layer 130, an active layer 140 below the first conductive semiconductor layer 130, and a second conductive semiconductor layer 150 below the active layer 140.

The light generated from the light emitting structure 145 may be directly emitted from the light emitting structure 145, or emitted by passing through the transmissive substrate 110. Particularly, the thickness of the transmissive substrate 110 is thicker than that of the light emitting structure 145, so that the light can be efficiently emitted through a lateral surface of the transmissive substrate 110. Accordingly, the light emission efficiency of the light emitting device 100 can be improved.

In addition, the ohmic layer 157 is interposed between the light emitting structure 145 and the transmissive substrate 110, so that power from the electrode layer 132 can be spread throughout the light emitting structure 145.

The transmissive substrate 110 is provided thereon with a buffer layer (not shown) and/or an undoped nitride layer (not shown) to reduce lattice constant difference.

Hereinafter, the light emitting device 100 according to the first embodiment will be described in detail in terms of on each component.

The transmissive substrate 110 may include light permeable material such as $Al_2O_3$, glass material, GaN, ZnO or AlN.

In this case, the transmissive substrate 110 preferably includes a material having a refractive index smaller than that of the light emitting structure 145. In this case, the light generated from the light emitting structure 145 can be more effectively emitted due to the refractive index difference.

For example, the transmissive substrate 110 may have a thickness of about 100 μm to about 1000 μm. Since the thickness is thicker than that of the light emitting structure 145, light can be effectively emitted through a lateral surface of the light emitting device 100.

Meanwhile, the transmissive substrate 110 is formed at the lateral surface thereof with roughness, so that light emission efficiency through a lateral surface of the light emitting device 100 can be maximized.

The ohmic layer 157 may be formed on the transmissive substrate 110. The ohmic layer 157 makes ohmic contact with the light emitting structure 145, so that power delivered from the electrode layer 132 can be spread throughout the light emitting structure 145.

The ohmic layer 157 may include a transparent material such that light generated from the light emitting structure 145 is smoothly incident onto the transmissive substrate 110 through the ohmic layer 157.

In detail, the ohmic layer 157 may include transparent metallic oxide or transparent metallic nitride. For example, the ohmic layer 157 may include at least one of the ITO, IZO(In—ZnO), GZO(Ga—ZnO), AZO(Al—ZnO), AGZO (Al—Ga ZnO), IGZO(In—Ga ZnO), $IrO_x$, $RuO_x$, $RuO_x$/ITO, $Ni/IrO_x/Au$, and $Ni/IrO_x/Au/ITO$.

The ohmic layer 157 may include a metallic thin film of a few nanometers (nm) to a few tens nanometers (nm) to transmit light. In this case, the ohmic layer 157 may include at least one of Ni, Pt, Ir, Rh, and Ag.

Meanwhile, the ohmic layer 157 may have various shapes depending on the design of the light emitting device 100, but the embodiment is not limited thereto. Details thereof will be made later.

An adhesive layer 120 may be interposed between the ohmic layer 157 and the transmissive substrate 110 to firmly bond the ohmic layer 157 with the transmissive substrate 110.

The adhesive layer 120 may include a transparent material with a bonding strength. For example, the adhesive layer 120 may include at least one of spin-on-glass (SOG), Sol-Gel, ITO, ZnO or $SiO_x$.

The light emitting structure 145 may be formed on the ohmic layer 157. The light emitting structure 145 has a structure to generate light. For example, the light emitting structure 145 may have a stack structure in which the second conductive semiconductor layer 150, the active layer 140, and the first conductive semiconductor layer 130 are sequentially stacked on each other.

For example, the second conductive semiconductor layer 150 may include a p-type semiconductor layer. The p-type semiconductor layer may include a semiconductor material, such as InAlGaN, GaN, AlGaN, InGaN, AlInN, AlN or InN, having a composition formula $In_xAl_yGa_{1-x-y}N$ ($0 \leq x \leq 1$, $0 \leq y \leq 1$, $0 \leq x+y \leq 1$). The p-type semiconductor layer may be doped with p-type dopants such as Mg and Zn.

The active layer 140 is formed on the second conductive semiconductor layer 150. Electrons (or holes) injected through the first conductive semiconductor layer 130 meet holes (or electrons) injected through the second conductive semiconductor layer 150 at the active layer 140, so that the active layer 140 emits the light based on the band gap difference of the energy band according to material of the active layer 140.

The active layer 140 may have one of a single quantum structure, a multi-quantum well structure, a quantum wire structure, and a quantum dot structure, but the embodiment is not limited thereto.

The active layer 140 may include a semiconductor material having a composition formula of $In_xAl_yGa_{1-x-y}N$ ($0 \leq x \leq 1$, $0 \leq y \leq 1$, $0 \leq x+y \leq 1$). If the active layer 140 is formed in the MQW structure, the active layer 140 may have a stack structure of plural well layers and plural barrier layers. For instance, the active layer 140 may have a stack structure of an InGaN well layer/a GaN barrier layer.

A clad layer (not shown) doped with n-type dopants or p-type dopants may be formed below and/or above the active layer 140, and may include an AlGaN layer or an InAlGaN layer.

The first conductive semiconductor layer 130 may further include an undoped semiconductor layer thereon, but the embodiment is not limited thereto.

The first conductive semiconductor layer 130 may include an n-type semiconductor layer, and the n-type semiconductor layer may include InAlGaN, GaN, AlGaN, InGaN, AlInN, AlN, or InN having a composition formula of $In_xAl_yGa_{1-x-y}N$ ($0 \leq x \leq 1$, $0 \leq y \leq 1$, $0 \leq x+y \leq 1$). The n-type semiconductor layer may be doped with n-type dopants such as Si, Ge, and Sn.

The undoped semiconductor layer is not doped with dopants, so that the undoped semiconductor layer has electrical conductivity lower than that of the first conductive semiconductor layer or the second conductive semiconductor layer 150. The undoped semiconductor layer may be grown in order to improve the crystalline of the first conductive semiconductor layer.

Meanwhile, different from the above description, the first conductive semiconductor layer 130 may include a p-type semiconductor layer, and the second conductive semiconductor layer 150 may include an n-type semiconductor layer. A third conductive semiconductor layer (not shown) including an n-type semiconductor layer or a p-type semiconductor layer may be formed on the first conductive semiconductor layer 130. Accordingly, the light emitting device 100 may have at least one of NP, PN, NPN, and PNP junction structures. The doping density of dopants of the first and second conductive semiconductor layers may be uniform or irregular. In other words, the light emitting structure 145 may have various structures, but the embodiment is not limited thereto.

The light emitting structure 145 may be provided on a top surface thereof with roughness or a pattern. Since the light emitting structure 145 may emit light at various angles due to the roughness or the pattern, the light extraction efficiency of the light emitting device 100 can be improved.

A protective member 155 may be formed on at least one lateral surface of the light emitting structure 145. The protective member 155 prevents the light emitting structure 145 from being electrically shorted with an external electrode.

The protective member 155 may include at least one of electrical insulation materials such as $SiO_2$, $Si_xO_y$, $Si_3N_4$, $Si_xN_y$, $SiO_xN_y$, $Al_2O_3$, and $TiO_2$.

An electrode 160 may be formed on the top surface of the light emitting structure 145. The electrode 160 can supply power to the light emitting structure 145 together with the electrode layer 132. The electrode 160 may have a single structure or a multiple structure including at least one of Al, Ti, Cr, Ta, Ag, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare-earth metal, alloy thereof, metallic silicide, semiconductor silicide, CNTNs, a transparent conductive oxide, or a transparent conductive nitride.

A current blocking layer (CBL, not shown) may be formed between the ohmic layer 157 and the second conductive semiconductor 150.

At least a portion of the CBL (not shown) overlaps with the electrode 160 in a direction perpendicular to the electrode 160 to prevent current from being concentrated through the shortest distant between the electrode 160 and the transmissive substrate 110. Accordingly, the light emission efficiency of the light emitting device 100 can be improved.

The CBL (not shown) may include a material having electrical conductivity lower than that of a reflective layer 158 or the ohmic layer 157, a material of making schottky contact with the second conductive semiconductor layer 150, or an electrical insulation material. For example, the CBL may include at least one of ITO, IZO, IZTO, IAZO, IGZO, IGTO, AZO, ATO, ZnO, $SiO_2$, $SiO_x$, $SiO_xN_y$, $Si_3N_4$, $Al_2O$, $TiO_x$, Ti, Al, or Cr.

The transmissive substrate 110 may be provided on the bottom surface thereof with the electrode layer 132, and may be provided therein with at least one conductive via 131 to electrically connect the electrode layer 132 with the light emitting structure 145 through the transmissive substrate 110.

At least a portion of the conductive via 131 may overlap with the electrode 160 in a direction perpendicular to the electrode 160, or the conductive via 131 may be provided at the lateral surface of the transmissive substrate 110, but the embodiment is not limited thereto.

Since the electrode layer 132 is formed on the bottom surface of the transmissive substrate 110, the light emitting device 100 may be mounted on an external electrode through a die bonding scheme.

The electrode layer 132 transfers power, which has been supplied from the external electrode, to the light emitting structure 145 through the conductive via 131. To this end, one end of the conductive via 131 may make contact with the electrode layer 132, and an opposite end of the conductive via 131 may make contact with at least one of the ohmic layer 157 or the light emitting structure 145.

Preferably, the electrode layer 132 and the conductive via 131 may include a high reflectance material to effectively reflect light incident from the light emitting structure 145. For example, the electrode layer may include at least one of Ag, Rh, Ni, Au, Pd, Ir, Ti, Pt, W or Al. Accordingly, light incident onto the electrode layer 132 and the conductive via 131 can be reflected and effectively emitted to the outside through the lateral surface of the transmissive substrate 110.

Hereinafter, a method of manufacturing the light emitting device 100 according to the first embodiment will be described in detail.

FIGS. 2 to 8 are views showing the method of manufacturing the light emitting device 100 according to the first embodiment.

Figure 2:
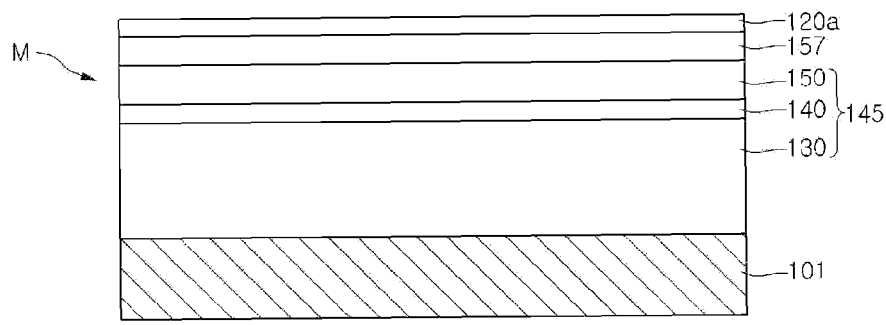
FIGS. 2 to 8 are sectional views showing a method of manufacturing a light emitting device according to the first embodiment.

Referring to FIG. 2, after growing the light emitting structure 145 from a growth substrate 101, the ohmic layer 157 is formed on the light emitting structure 145, and a first adhesive layer 120a is formed on the ohmic layer 157, thereby providing a first body M.

For example, a growth substrate 101 may include at least one of $Al_2O_3$, SiC, GaAs, GaN, ZnO, Si, GaP, $LiAl_2O_3$, InP, BN, AlN or Ge.

The light emitting structure 145 may be formed on the growth substrate 101 through a Metal Organic Chemical Vapor Deposition (MOCVD) scheme, a Chemical Vapor Deposition (CVD) scheme, a Plasma-Enhanced Chemical Vapor Deposition (PECVD) scheme, a Molecular Beam Epitaxy (MBE) scheme, or a Hydride Vapor Phase Epitaxy (HVPE) scheme, but the embodiment is not limited thereto.

The ohmic layer 157 and the first adhesive layer 120a may be formed through deposition schemes such as a sputtering scheme and a PECVD E-beam deposition scheme or coating schemes such as a spin coating scheme and a deep coating scheme, but the embodiment is not limited thereto.

The first adhesive layer 120a may include a material capable of firmly coupling the first body M with a second body N while transmitting light.

Figure 3:
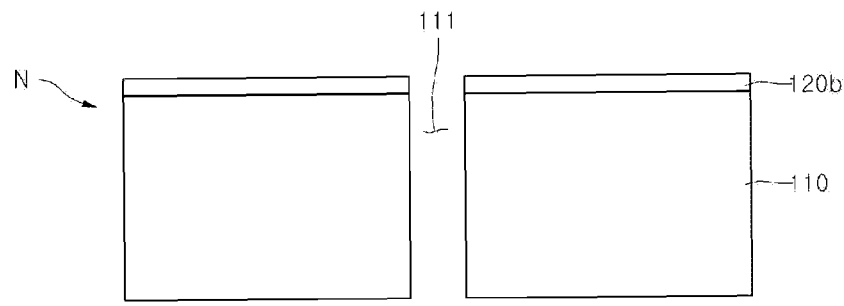

Referring to FIG. 3, after forming a second adhesive layer 120b to be bonded with the first adhesive layer 120a on the top surface of the transmissive substrate 110, a hole 111 is formed through the transmissive substrate 110, thereby providing the second body N.

For example, the hole 111 may be formed through laser drilling or etching.

Although one hole 111 is shown in FIG. 3, a plurality of holes 111 may be provided.

Figure 4:
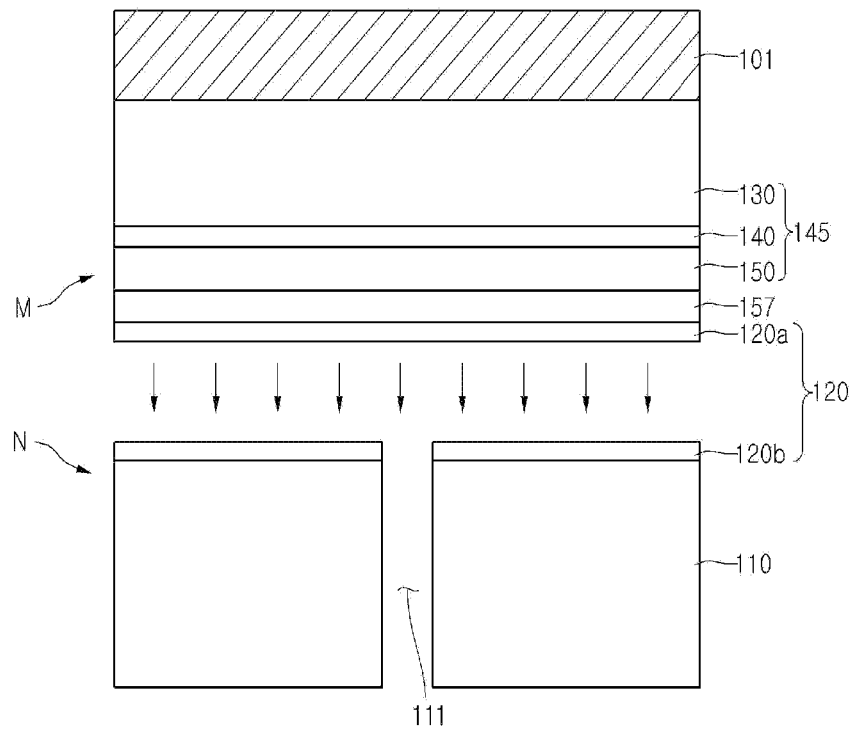

Referring to FIG. 4, the first adhesive layer 120a is bonded with the second adhesive layer 120b in opposition to the second adhesive layer 120b, so that the first body M can be bonded with the second body N.

In this case, the first adhesive layer 120a is bonded with the second adhesive layer 120b, thereby forming the adhesive layer 120.

Figure 5:
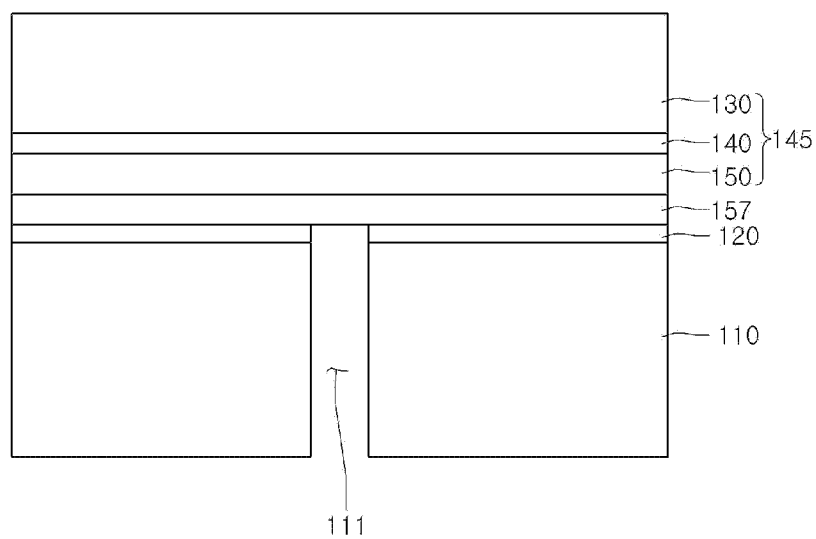

Referring to FIG. 5, the growth substrate 101 may be removed from the first body M and the second body N which are bonded with each other.

The growth substrate 101 may be removed through at least one of a Laser Lift Off (LLO) process and an etching process, but the embodiment is not limited thereto.

Figure 6:
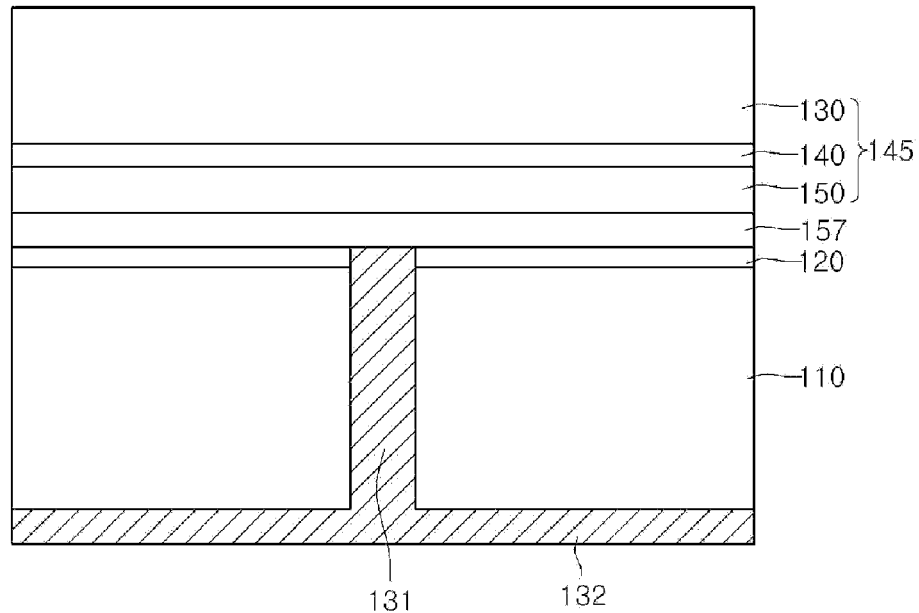

Referring to FIG. 6, the hole 111 may be filled with a conductive material to form the conductive via 131, and the electrode layer 132 may be formed on the bottom surface of the transmissive substrate 110.

The conductive via 131 and the electrode layer 132 may be formed through a plating scheme or a deposition scheme, and may include the same material.

Meanwhile, if a portion of the adhesive layer 120 remains in the hole 111, the remaining portion may be removed through an etching process and then the conductive via 131 may be formed, but the embodiment is not limited thereto.

Preferably, the electrode layer 132 and the conductive via 131 may include a high reflectance material to effectively reflect light incident from the light emitting structure 145. For example, the electrode layer 132 may include at least one of Ag, Rh, Ni, Au, Pd, Ir, Ti, Pt, W or Al.

Figure 7:
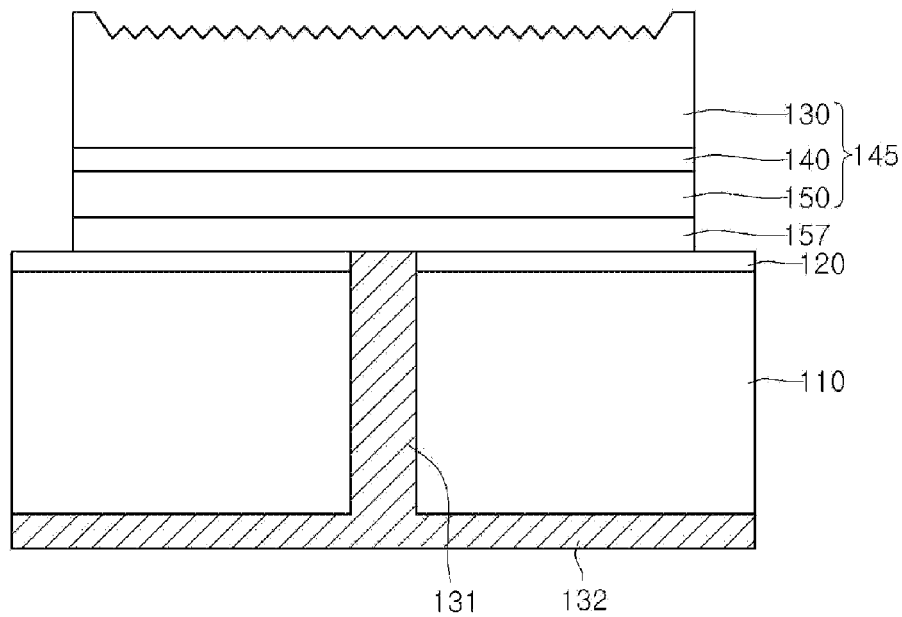

Referring to FIG. 7, an isolation etching may be performed with respect to the light emitting structure 145, thereby forming roughness or a pattern on the top surface of the light emitting structure 145.

Through the isolation etching process, a plurality of light emitting devices may be divided into individual device units.

The roughness or the pattern may be formed to improve light extraction efficiency. For example, the roughness or the pattern may be formed through an etching process or a patterning process.

In addition, an exposed portion of the ohmic layer 157 may be removed through the isolation etching process. The exposed portion of the ohmic layer 157 is removed, so that the light emitting device 100 may be prevented from being electrically shorted with an external electrode, but the embodiment is not limited thereto.

Figure 8:
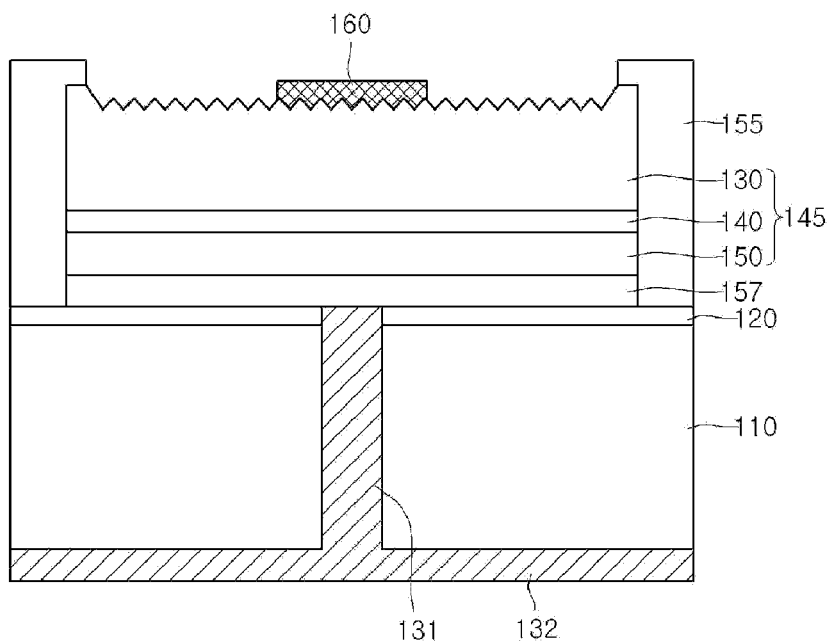

Referring to FIG. 8, the electrode 160 is formed on the light emitting structure 145, and the protective member 155 is formed at the lateral side of the light emitting structure 145, thereby providing the light emitting device 100 according to the first embodiment.

The electrode 160 may be formed through a deposition scheme or a plating scheme, but the embodiment is not limited thereto.

The protective member 155 may be formed through a sputtering scheme, a PECVD scheme, or an E-beam deposition scheme. In addition, the protective member 155 may be additionally formed at a peripheral portion of the top surface of the light emitting structure 145 as well as at the lateral surface of the light emitting structure 145, but the embodiment is not limited thereto.

Meanwhile, a chip separating process can be performed as a subsequent process to divide a plurality of light emitting devices into individual device units. In general, the chip separating process may include a laser scribing process and a braking process.

Since the light emitting device 100 may include the transmissive substrate 110 instead of a metallic substrate, the laser scribing process and the braking process may be easily performed to form an individual chip.

In addition, the chip separating process is not separated from the isolation etching process, but performed together with the isolation etching process, so that efficiency for the manufacturing process of the light emitting device 100 can be increased.

Hereinafter, various embodiments will be described according to the shapes of the ohmic layer 157. However, the description of the repeated components will be omitted or simplified.

Figure 9:
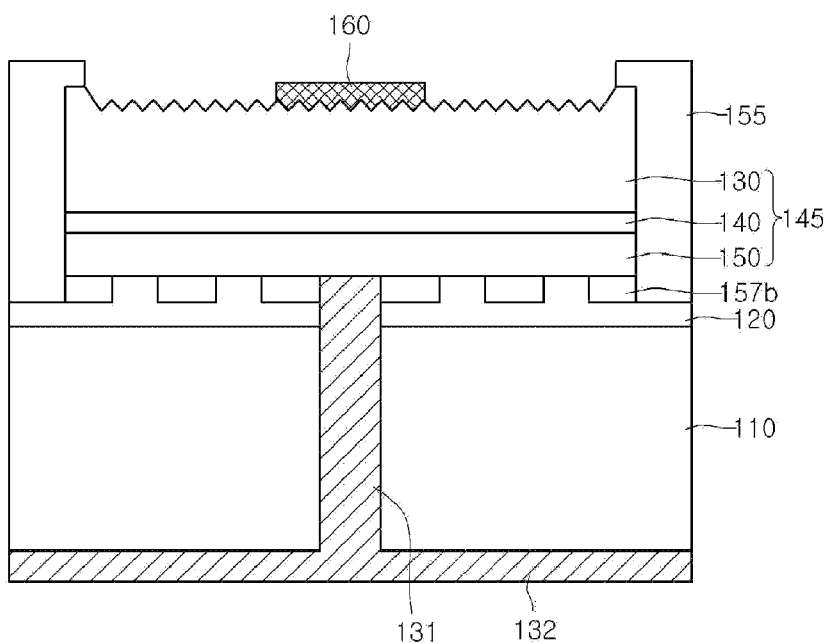
FIG. 9 is a sectional view showing a light emitting device according to a second embodiment.
Figure 10:
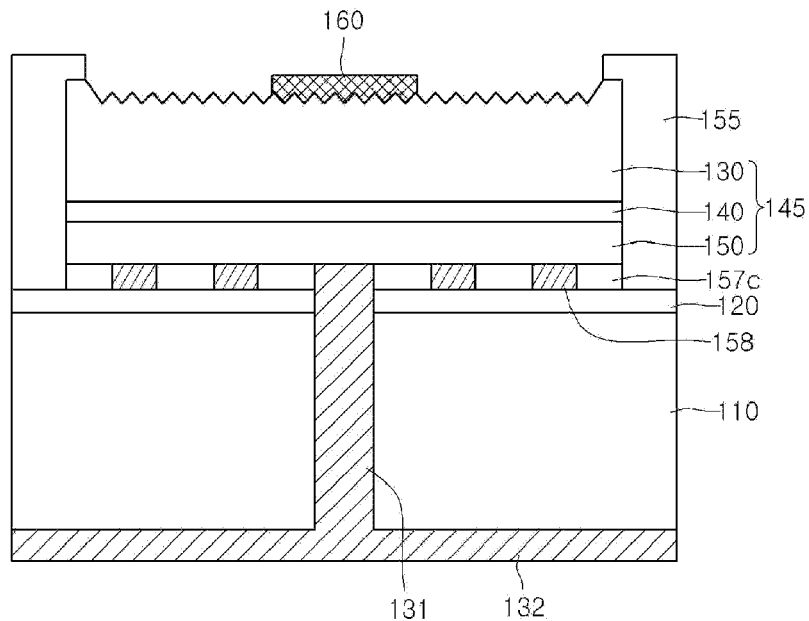
FIG. 10 is a sectional view showing a light emitting device according to a third embodiment.
Figure 11:
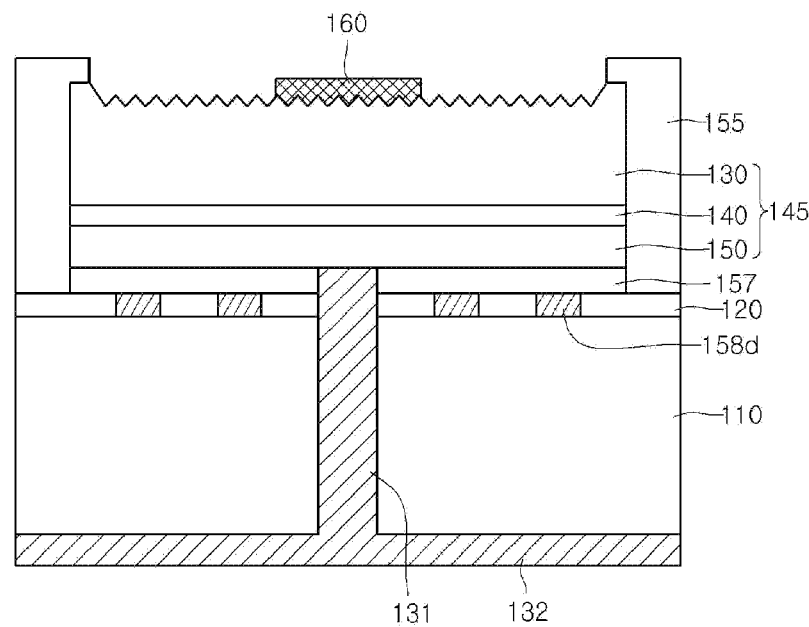
FIG. 11 is a sectional view showing a light emitting device according to a fourth embodiment.

FIGS. 9 to 11 are sectional views showing various embodiments according to the shapes of the ohmic layer 157.

(Second Embodiment)

Referring to FIG. 9, a light emitting device 100B according to a second embodiment includes the transmissive substrate 110, the adhesive layer 120 above the transmissive substrate 110, an ohmic layer 157b selectively formed at a portion of a top surface of the adhesive layer 120, the light emitting structure 145 formed on the ohmic layer 157b and the adhesive layer 120 to generate light, the electrode layer 132 formed on the bottom surface of the transmissive substrate 110, and the conductive via 131 to electrically connect the light emitting structure 145 with the electrode layer 132 through the transmissive substrate 100.

The ohmic layer 157b may be selectively formed at the portion of the top surface of the adhesive layer 120. Accordingly, the bottom surface of the light emitting structure 145 makes contact with the ohmic layer 157b and the adhesive layer 120.

In addition, one end of the conductive via 131 may make contact with the light emitting structure 145.

When the adhesive layer 120 includes an insulation material, the light emitting structure 145 comes into ohmic contact with the ohmic layer 157b, and the conductive via 131 includes a material that comes into schottky contact with the light emitting structure 145, power is prevented from flowing through the shortest distance between the electrode 160 and the conductive via 131, so that the power can be uniformly spread in the light emitting structure 145.

(Third Embodiment)

Referring to FIG. 10, a light emitting device 100C according to a third embodiment includes the transmissive substrate 110, the adhesive layer 120 on the transmissive substrate 110, an ohmic layer 157c and a reflective layer 158, which are selectively formed at a portion of the adhesive layer 120, the light emitting structure 145 formed on the ohmic layer 157c and the reflective layer 158 to generate light, the electrode layer 132 formed on the bottom surface of the transmissive substrate 110, and the conductive via 131 to electrically connect the light emitting structure 145 with the electrode layer 132 through the transmissive substrate 110.

The ohmic layer 157c and the reflective layer 158 may be formed on the adhesive layer 120. As shown in FIG. 10, the ohmic layer 157c and the reflective layer 158 may be selectively patterned.

The ohmic layer 157c may include a light permeable material, and the reflective layer 158 may include a light reflecting material. Accordingly, light incident onto the ohmic layer 157c from the light emitting structure 145 is transmitted to the transmissive substrate 110, and light incident onto the reflective layer 158 from the light emitting structure 145 is reflected to the light emitting structure 145 and output to the outside.

The reflective layer 158 may include at least one of Ag, Rh, Ni, Au, Pd, Ir, Ti, Pt, W or Al.

Meanwhile, when the reflective layer 158 and the conductive via 131 make schottky contact with the light emitting structure 145, power is prevented from flowing through the shortest distance between the electrode 160 and the conductive via 131, so that the power is uniformly spread in the light emitting structure 145.

(Fourth Embodiment)

Referring to FIG. 11, a light emitting device 100D according to a fourth embodiment includes the transmissive substrate 110, the adhesive layer 120 and a reflective layer 158*d* on the transmissive substrate 110, the ohmic layer 157 on the adhesive layer 120 and the reflective layer 158*d*, the light emitting structure 145 formed on the ohmic layer 157 to generate light, the electrode layer 132 formed on the bottom surface of the transmissive substrate 110, and the conductive via 131 to electrically connect the light emitting structure 145 with the electrode layer 132 through the transmissive substrate 110.

The reflective layer 158*d* includes a light reflecting material. For example, the reflective layer 158*d* may include at least one of Ag, Rh, Ni, Au, Pd, Ir, Ti, Pt, W or Al.

Accordingly, light incident onto the reflective layer 158*d* from the light emitting structure 145 is reflected toward the light emitting structure 145 and output to the outside. In addition, light incident into a region between the reflective layers 158*d* from the light emitting structure 145 may be incident onto the transmissive substrate 110 and output through the lateral surface of the transmissive substrate 110. However, the embodiment is not limited thereto.

Meanwhile, when on end of the conductive via 131 makes schottky contact with the light emitting structure 145, power is prevented from flowing through the shortest distance between the electrode 160 and the conductive via 131, so that the power can be uniformly spread within the light emitting structure 145.

Hereinafter, a light emitting device 100E according to a fifth embodiment will be described in detail, and the description of the repeated components will be omitted or simplified.

Figure 12:
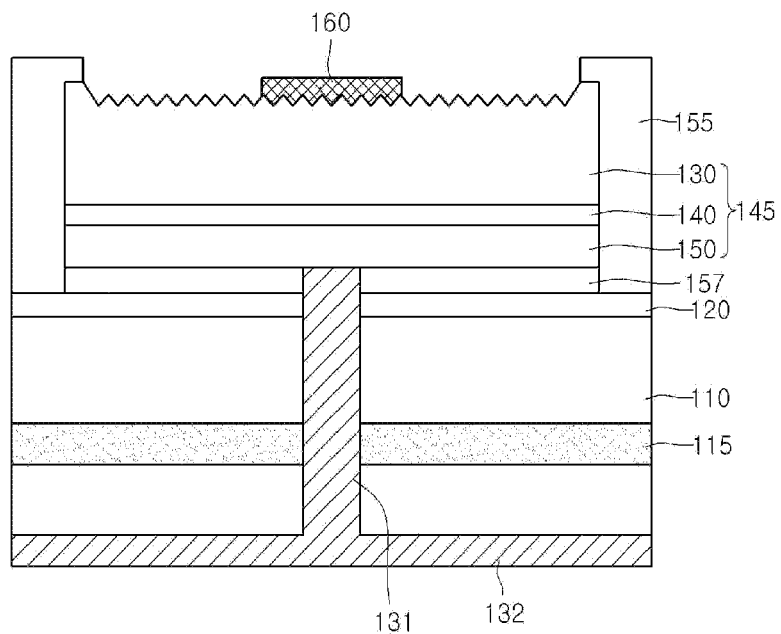
FIG. 12 is a sectional view showing a light emitting device according to a fifth embodiment.

FIG. 12 is a sectional view showing the light emitting device 100E according to the fifth embodiment. The light emitting device 100E according to the fifth embodiment has the same structure as that of the light emitting device 100 according to the first embodiment except that the light emitting device 100E includes an optical conversion layer.

Referring to FIG. 12, the light emitting device 100E according to the fifth embodiment includes the transmissive substrate 110 including an optical conversion layer 115, the ohmic layer 157 on the transmissive substrate 110, the light emitting structure 145 formed on the ohmic layer 157 to generate light, the electrode layer 132 formed on the bottom surface of the transmissive substrate 110, and the conductive via 131 to electrically connect the light emitting structure 145 with the electrode layer 132 through the transmissive substrate 110.

The transmissive substrate 110 may include the optical conversion 115. The optical conversion layer 115 is formed at one of an upper portion, a middle portion, and a lower portion of the transmissive substrate 110 or at a lateral surface of the transmissive substrate 110, but the embodiment is not limited thereto.

For example, the optical conversion layer 115 can be formed by adding phosphors to resin or silicon. Since the optical conversion layer 115 includes the phosphors, the optical conversion layer 115 may change the wavelength of light incident onto the optical conversion layer 115 from the light emitting structure 145.

For example, when first light generated from the light emitting structure 145 is incident onto the optical conversion layer 115, the phosphor of the optical conversion layer 115 is excited by the first light to generate second light. Accordingly, the light emitting device 100E can emit the mixture of the first light and the second light.

For example, when the optical conversion layer 115 includes yellow phosphors, and the light emitting structure 145 generates blue light, the light emitting device 100E according to the embodiment can emit white light.

Hereinafter, a light emitting device 100F according to a sixth embodiment will be described in detail. The description of the repeated components will be omitted or simplified.

Figure 13:
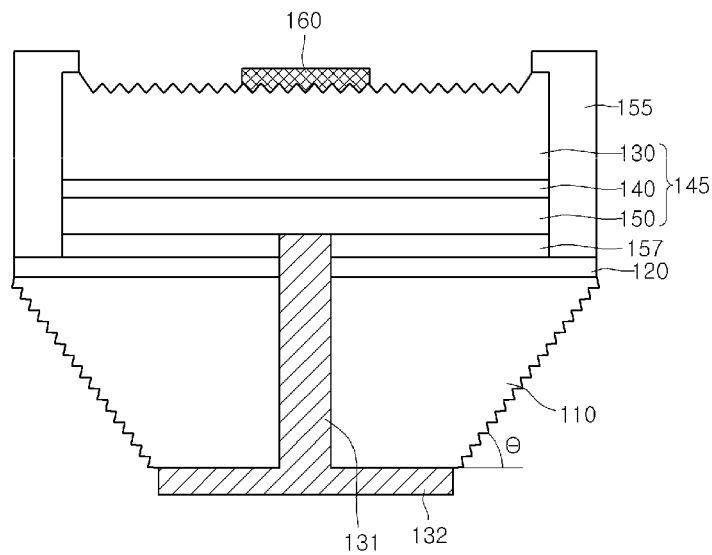
FIG. 13 is a sectional view showing a light emitting device according to a sixth embodiment.

FIG. 13 is a sectional view showing the light emitting device 100F according to the sixth embodiment. The light emitting device 100F according to the sixth embodiment has the same structure as that of the light emitting device 100 according to the first embodiment except for the shape of the transmissive substrate 110.

Referring to FIG. 13, a portion of a lower corner may be removed from the transmissive substrate 110 of the light emitting device 100F according to the sixth embodiment. Accordingly, the top surface of the transmissive substrate 110 has an area different from that of the bottom surface of the transmissive substrate 110.

The lateral surface of the transmissive substrate 110 without a portion of the lower corner may have the shape of a flat surface, roughness or pattern of a concave surface or a convex surface.

The roughness or pattern on the lateral surface of the transmissive substrate 110 may selectively formed on upper portion or lower portion.

Accordingly, the area of the transmissive substrate 110 is increased toward an upper portion thereof from a lower portion, but the embodiment is not limited thereto.

The lateral surface of the transmissive substrate 110 and the bottom surface of the transmissive substrate 110 may be formed to have angle of $\theta$. The $\theta$ may have 20° to 70°.

Since the transmissive substrate 110 has the above shape, the volume of the transmissive substrate 110 is reduced. Accordingly, an amount of light, which is confined inside of the transmissive substrate 110 without being emitted to the outside thereof, is minimized, so that the light extraction efficiency of the light emitting device 100F can be improved.

In addition, the light extraction efficiency can be improved by allowing the transmissive substrate 110 to have a curved lateral surface.

Figure 14:
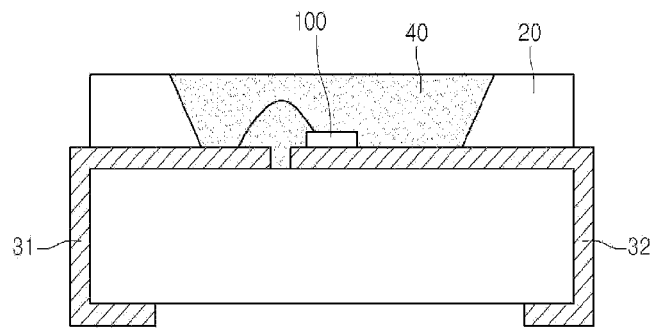
FIG. 14 is a sectional view showing a light emitting device package including a light emitting device according to the embodiment.

FIG. 14 is a sectional view showing a light emitting device package including the light emitting device 100 according to the embodiment.

Referring to FIG. 14, the light emitting device package according to the embodiment includes a body 20, first and second electrode layers 31 and 32 mounted on the body 20, the light emitting device 100 according to the embodiment, which is mounted on the body 20 and electrically connected with the first and second electrode layers 31 and 32, and a molding member 40 surrounding the light emitting device 100.

The body 20 may include silicon, synthetic resin or metal, and may have an inclined surface around the light emitting device 100.

The first and second electrode layers 31 and 32 are electrically insulated from each other, and power is supplied to the light emitting device 100. The first and second electrode layers 31 and 32 reflect light generated from the light emitting device 100 to increase light efficiency, and discharge heat emitted from the light emitting device 100 to the outside thereof.

The light emitting device 100 may be mounted on the body 20, or may be mounted on the first electrode layer 31 or the second electrode layer 32.

The light emitting device 100 is electrically connected with the first and second electrode layers 31 and 32 through a wire bonding scheme, a die bonding scheme, or a flip chip scheme to generate light, but the embodiment is not limited thereto.

The molding member 40 may surround the light emitting device 100 to protect the light emitting device 100. The molding member 40 includes phosphors to change the wavelength of light emitted from the light emitting device 100.

The light emitting device package may include at least one of the disclosed light emitting devices according to the embodiments or a plurality of the disclosed light emitting devices, but the embodiment is not limited thereto.

A plurality of light emitting device packages according to the embodiment may be arrayed on a substrate, and an optical member including a light guide plate, a prism sheet, and a diffusion sheet may be provided on the optical path of the light emitting device package. The light emitting device package, the substrate, and the optical member may constitute a light unit. According to another embodiment, the light emitting devices or the light emitting device package according to the embodiments can constitute a display apparatus, an indicator, or an illumination system. For example, the illumination system may include a lamp or a street lamp.

Figure 15:
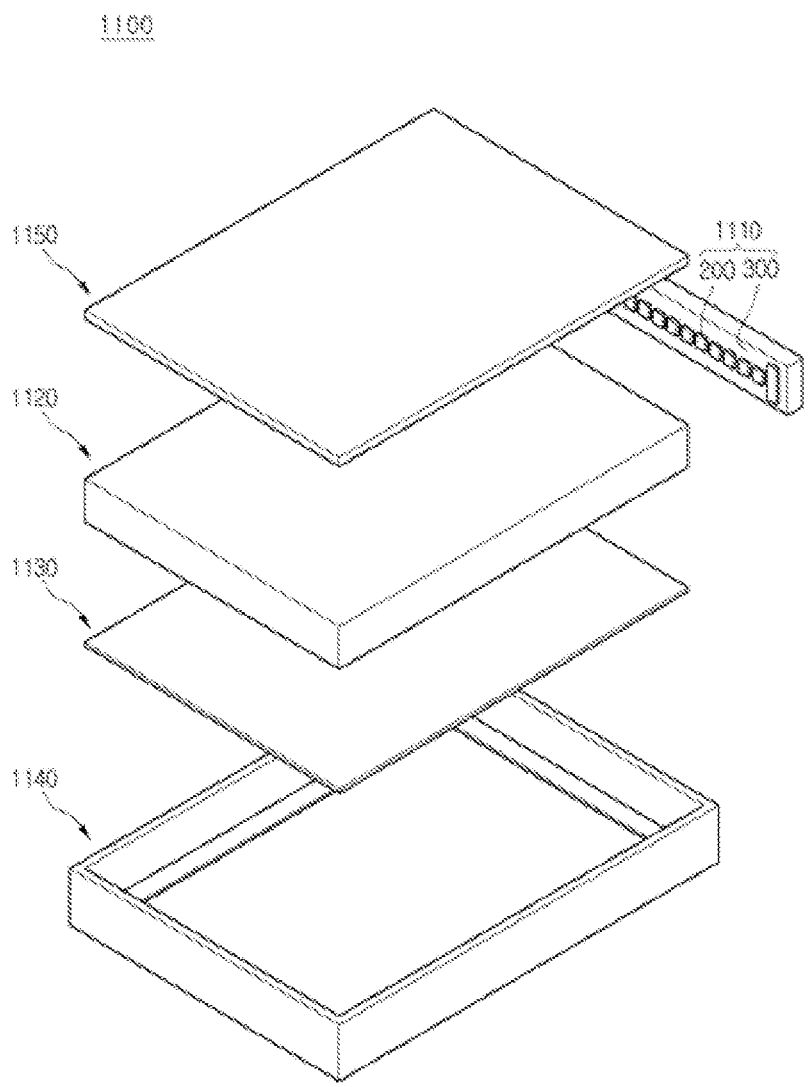
FIG. 15 is a view showing a backlight unit including a light emitting device or a light emitting device package according to the embodiment.

FIG. 15 is a view showing a backlight unit 1100 including a light emitting device package according to the embodiment. The backlight unit 1100 of FIG. 15 is one example of an illumination system, and the embodiment is not limited thereto.

Referring to FIG. 15, the backlight unit 1100 includes a bottom frame 1140, a light guide member 1120 provided in the bottom frame 1140, and a light emitting module 1110 provided at one lateral surface or a bottom surface of the light guide member 1120. In addition, the reflective sheet 1130 may be provided below the light guide member 1120.

The bottom frame 1140 may have the shape of a box with an open top surface to receive the light guide member 1120, the light emitting module 1110, and the reflective sheet 1130 therein. The bottom frame 1140 may include metal or resin, but the embodiment is not limited thereto.

The light emitting module 1110 may include a substrate and a plurality of light emitting device packages according to the embodiments mounted on the substrate. The light emitting device packages may provide light to the light guide member 1120.

As shown in FIG. 15, the light emitting module 1110 may be provided at least one internal lateral surface of the bottom frame 1140. Accordingly, the light emitting module 1110 can supply light toward at least one lateral surface of the light guide member 1120.

The light emitting module 1110 is provided below the bottom frame 1140 to supply light toward a bottom surface of the light guide member 1120, and this may be variously modified according to the design of the backlight unit 1100. Accordingly, the embodiment is not limited thereto.

The light guide member 1120 may be provided in the bottom frame 1140. The light guide member 1120 may convert the light emitted from the light emitting module 1110 into surface light to guide the surface light to a display panel (not shown).

The light guide member 1120 may include a light guide plate (LGP). The light guide plate may include one of acrylic resin such as polymethyl methacrylate (PMMA), polyethylene terephthalate (PET), poly carbonate (PC), COC, and polyethylene naphthalate (PEN) resin.

An optical sheet 1150 may be provided on the light guide member 1120.

For example, the optical sheet 1150 may include at least one of a diffusion sheet, a light collecting sheet, a brightness enhancement sheet, and a fluorescence sheet. For example, the optical sheet 1150 may have a stack structure of the diffusion sheet, the light collecting sheet, the brightness enhancement sheet, and the fluorescence sheet. The diffusion sheet 1150 uniformly diffuses light emitted from the light emitting module 1110, and the diffused light may be collected to a display panel (not shown) by using the light collecting sheet. The light output from the light collecting sheet has been randomly polarized. The brightness enhancement sheet may increase the degree of polarization of the light output from the light collecting sheet. The light collecting sheet may include a horizontal and/or vertical prism sheet. The brightness enhancement sheet may include a dual brightness enhancement film. The fluorescence sheet may include a transparent plate or film including phosphors.

The reflective sheet 1130 may be provided below the light guide member 1120. The reflective sheet 1130 may reflect light output through the bottom surface of the light guide member 1120 to the exit surface of the light guide member 1120.

The reflective sheet 1130 includes a resin material such as PET, PC, and PVC having superior reflectance, but the embodiment is not limited thereto.

Figure 16:
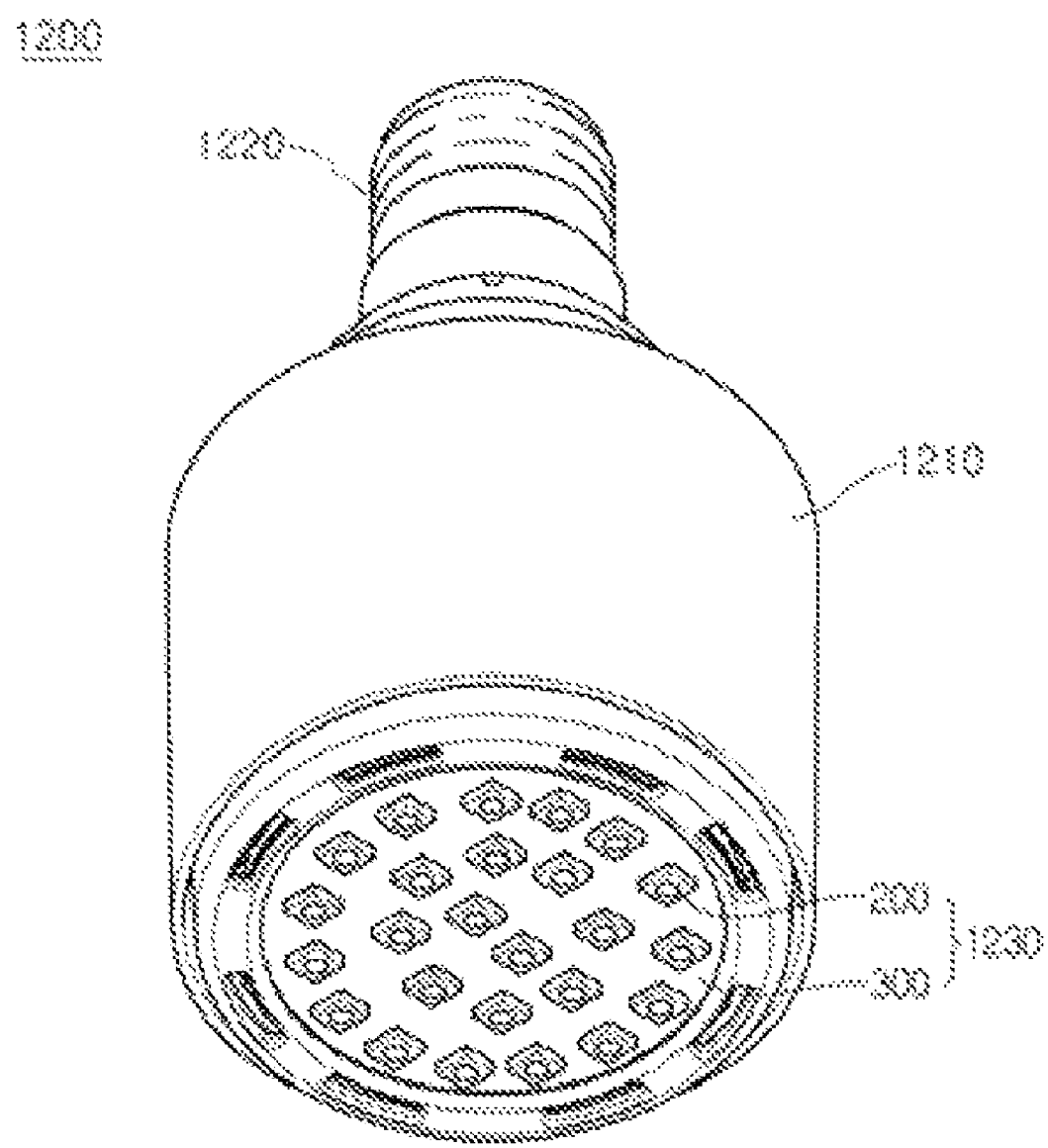
FIG. 16 is a view showing an illumination unit including a light emitting device or a light emitting device package according to the embodiment.

FIG. 16 is a perspective view showing an illumination unit 1200 including the light emitting device package according to the embodiments. The illumination unit 1200 shown in FIG. 16 is an example of an illumination system and the embodiment is not limited thereto.

Referring to FIG. 16, the illumination unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 300 and at least one light emitting device package 200 installed on the substrate 300.

The substrate 300 includes an insulating member printed with a circuit pattern. For instance, the substrate 300 includes a PCB (printed circuit board), an MC (metal core) PCB, an F (flexible) PCB, or a ceramic PCB.

In addition, the substrate 300 may include material that effectively reflects the light. The surface of the substrate 300 can be coated with a color, such as a white color or a silver color, to effectively reflect the light.

At least one light emitting device package 200 according to the embodiment can be installed on the substrate 300. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 16, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the illumination system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a transmissive substrate;
    an ohmic layer on the transmissive substrate;
    a light emitting structure on the ohmic layer and including a first conductive semiconductor layer, a second conductive semiconductor layer, and an active layer between the first and second semiconductor layers;
    an electrode layer on a bottom surface of the transmissive substrate; and
    a conductive via electrically connecting the light emitting structure with the electrode layer through the transmissive substrate;
    wherein an area of the transmissive substrate is increased toward an upper portion thereof from a lower portion.

2. The light emitting device of claim 1, wherein the transmissive substrate has a thickness of about 100 µm to about 1000 µm.

3. The light emitting device of claim 1, wherein the transmissive substrate includes at least one of sapphire ($Al_2O_3$), a glass material, GaN, ZnO, or AlN.

4. The light emitting device of claim 1, wherein the transmissive substrate has a refractive index smaller than a refractive index of the light emitting structure.

5. The light emitting device of claim 1, further comprising an adhesive layer disposed between the ohmic layer and the transmissive substrate.

6. The light emitting device of claim 5, wherein the adhesive layer includes at least one of Spin-On-Glass, Sol-Gel, ITO, ZnO, or $SiO_x$.

7. The light emitting device of claim 1, wherein a lateral surface of the transmissive substrate and the bottom surface of the transmissive substrate are formed to have an angle θ of about 20° to 70°.

8. The light emitting device of claim 6, wherein a lateral surface of the transmissive substrate has at least one of a flat shape, a roughness, a pattern of a concave shape, or a convex shape.

9. The light emitting device of claim 7, wherein the roughness or pattern on the lateral surface of the transmissive substrate is selectively formed on the upper portion or the lower portion.

10. The light emitting device of claim 1, wherein the transmissive substrate includes an optical conversion layer including phosphors to change a wavelength of incident light.

11. The light emitting device of claim 1, wherein the ohmic layer makes ohmic contact with the light emitting structure and includes one of a metallic oxide, a metallic nitride, or a metallic thin film.

12. The light emitting device of claim 1, wherein the ohmic layer is selectively disposed at a portion of the transmissive substrate.

13. The light emitting device of claim 1, further comprising a reflective layer on the transmissive substrate to make schottky contact with the light emitting structure.

14. The light emitting device of claim 12, wherein the reflective layer is selectively disposed at a portion of the transmissive substrate.

15. The light emitting device of claim 1, further comprising a protective member disposed on at least one lateral surface of the light emitting structure.

16. The light emitting device of claim 15, wherein the protective member includes at least one of $SiO_2$, $Si_xO_y$, $Si_3N_4$, $Si_xN_y$, $SiO_xN_y$, $Al_2O_3$, and $TiO_2$.

17. The light emitting device of claim 1, wherein the electrode layer includes at least one of Ag, Rh, Ni, Au, Pd, Ir, Ti, Pt, W or Al.

18. The light emitting device of claim 1, wherein the conductive via makes schottky contact with the light emitting structure.

19. A light emitting device package comprising:
    a package body;
    a first electrode and a second electrode on the package body; and
    a light emitting device on the package body and electrically connected with the first and second electrodes,
    wherein the light emitting device comprises:
        a transmissive substrate;
        an ohmic layer on the transmissive substrate;
        a light emitting structure on the ohmic layer including a first conductive semiconductor layer and a second conductive semiconductor layer and an active layer between the first and second conductive semiconductor layers to generate light;
        an electrode layer on a bottom surface of the transmissive substrate; and
        a conductive via electrically connecting the light emitting structure with the electrode layer through the transmissive substrate
        wherein an area of the transmissive substrate is increased toward an upper portion thereof from a lower portion.

20. An illumination system comprising:
    a light emitting module including a substrate and a light emitting device on the substrate,
    wherein the light emitting device comprises:
        a transmissive substrate;
        an ohmic layer on the transmissive substrate;
        a light emitting structure on the ohmic layer including a first conductive semiconductor layer and a second conductive semiconductor layer and an active layer between the first and second conductive semiconductor layers to generate light;

an electrode layer on a bottom surface of the transmissive substrate; and a conductive via electrically connecting the light emitting structure with the electrode layer through the transmissive substrate wherein an area of the transmissive substrate is increased toward an upper portion thereof from a lower portion.

* * * * *